US012195402B2

(12) United States Patent
Zhang (10) Patent No.: US 12,195,402 B2
(45) Date of Patent: Jan. 14, 2025

(54) MULTI-LAYER COMPOSITE CERAMIC PLATE AND MANUFACTURING METHOD THEREOF (71) Applicant: RAYCER ADVANCED MATERIALS TECHNOLOGY CO., LTD, Yantai (CN)

(72) Inventor: Juxian Zhang, Yantai (CN)

(73) Assignee: RAYCER ADVANCED MATERIALS TECHNOLOGY CO., LTD, Yantai (CN)

(*) Notice: Subject to any disclaimer, the term of this patent is extended or adjusted under 35 U.S.C. 154(b) by 0 days.

(21) Appl. No.: 17/912,046

(22) PCT Filed: Feb. 19, 2021

(86) PCT No.: PCT/CN2021/076782
§ 371 (c)(1),
(2) Date: Sep. 16, 2022

(87) PCT Pub. No.: WO2021/190207
PCT Pub. Date: Sep. 30, 2021

(65) Prior Publication Data
US 2023/0140614 A1 May 4, 2023

(30) Foreign Application Priority Data
Mar. 27, 2020 (CN) .......................... 202010234112.9

(51) Int. Cl.
*C04B 37/00* (2006.01)
*C04B 35/10* (2006.01)
(Continued)

(52) U.S. Cl.
CPC ............ *C04B 37/003* (2013.01); *C04B 35/10* (2013.01); *C04B 35/645* (2013.01);
(Continued)

(58) Field of Classification Search
CPC ..... C04B 37/003; C04B 35/10; C04B 35/645; C04B 2235/3217; C04B 2235/612;
(Continued)

(56) References Cited

U.S. PATENT DOCUMENTS 6,723,274 B1 * 4/2004 Divakar ................ C04B 35/581
264/618
2006/0012087 A1 * 1/2006 Matsuda ............... C04B 35/111
264/619

(Continued)

FOREIGN PATENT DOCUMENTS

CN 1407956 A 4/2003
CN 103050429 A 4/2013
(Continued)

OTHER PUBLICATIONS

Search Report of CN application No. 2020102341129 issued on Nov. 30, 2021.
(Continued)

*Primary Examiner* — Christopher W Raimund
(74) *Attorney, Agent, or Firm* — Andrew C. Cheng (57) ABSTRACT

Disclosed are a multi-layer composite ceramic plate and a manufacturing method thereof. The composite ceramic plate includes at least one basic sandwich structure. The manufacturing method includes: preparing a sheet-like green body with ceramic powders; pre-sintering the green body at a pre-sintering temperature lower than the sintering temperature to obtain a pre-sintered ceramic member with certain strength; forming a metal electrode layer on an upper surface of the pre-sintered ceramic member; placing the pre-sintered ceramic member in a mold, with the upper surface coated with the metal electrode layer facing upwards; providing a ceramic precursor layer on the upper surface of the pre-sintered ceramic member; carrying out hot-pressing sintering in the axial direction of the pre-sintered ceramic member (Continued)

at the sintering temperature to form an integral structure, wherein by the hot-pressing sintering, a second ceramic layer is formed by the pre-sintered ceramic member, a first ceramic layer is formed by the ceramic precursor layer, and the metal electrode layer is located between the first ceramic layer and the second ceramic layer to from a basic sandwich structure together with the first ceramic layer and the second ceramic layer.

9 Claims, 4 Drawing Sheets

(51) Int. Cl.
*C04B 35/645* (2006.01)
*H01L 21/67* (2006.01)
*H01L 21/683* (2006.01)

(52) U.S. Cl.
CPC *C04B 2235/3217* (2013.01); *C04B 2235/612* (2013.01); *C04B 2235/656* (2013.01); *C04B 2237/122* (2013.01); *C04B 2237/343* (2013.01); *C04B 2237/52* (2013.01); *C04B 2237/74* (2013.01); *H01L 21/67103* (2013.01); *H01L 21/6831* (2013.01)

(58) Field of Classification Search
CPC ........ C04B 2235/656; C04B 2237/122; C04B 2237/343; C04B 2237/52; C04B 2237/74; C04B 2235/604; C04B 35/622; C04B 2235/6567; C04B 2237/348; C04B 2237/365; C04B 2237/368; C04B 2235/661; C04B 2235/9638; C04B 2237/366; C04B 2237/68; C04B 41/5133; C04B 41/88; C04B 37/006; C04B 2237/12; C04B 2237/34; C04B 2237/36; H01L 21/67103; H01L 21/6831; H01L 21/67098; B32B 18/00
See application file for complete search history.

(56) References Cited

U.S. PATENT DOCUMENTS

| | | |
|---|---|---|
| 2007/0217117 A1 | 9/2007 | Ohta |
| 2008/0174930 A1 | 7/2008 | Hattori |
| 2012/0248716 A1 | 10/2012 | Nobori |

FOREIGN PATENT DOCUMENTS

| | | | | |
|---|---|---|---|---|
| CN | 107527852 A | * | 12/2017 | ......... H01L 21/6831 |
| EP | 1602635 A1 | | 12/2005 | |
| JP | 1986106413 A | | 5/1986 | |
| JP | H04300138 A | | 10/1992 | |
| JP | H05318427 A | | 12/1993 | |
| JP | 2004521052 A | | 7/2004 | |
| JP | 2005064497 A | | 3/2005 | |
| JP | 2005159334 A | | 6/2005 | |
| JP | 2012216816 A | | 11/2012 | |
| KR | 10-2002-0059439 A | | 7/2002 | |
| KR | 10-0645349 B1 | | 11/2006 | |
| KR | 10-1929053 B1 | | 12/2018 | |

OTHER PUBLICATIONS

The Office Action of JP application No. 2022-556137 issued on Sep. 12, 2023.
The extended European Search Report of EP application No. 21775036.3 issued on Aug. 4, 2023.
The Office Action of JP application No. 2022-556137 issued on Apr. 23, 2024.
The Office Action of KR patent application No. 10-2022-7033113 issued on Sep. 27, 2024.

* cited by examiner

MULTI-LAYER COMPOSITE CERAMIC PLATE AND MANUFACTURING METHOD THEREOF

FIELD

The present invention relates to the field of semiconductors and material science, and particularly relates to a multi-layer composite ceramic plate in a semiconductor manufacturing process field, and a manufacturing method thereof, in particular to an electrostatic chuck (ESC) and a ceramic heating plate, and a manufacturing method thereof.

BACKGROUND

Multi-layer composite ceramic plates are widely applied in semiconductor manufacturing apparatus. The multi-layer composite ceramic plates in the semiconductor processing field include electrostatic chucks and ceramic heating plates according to their difference in specific function and structure, and some electrostatic chucks have the function of heating plates. In the semiconductor processing equipment, the electrostatic chucks are used to steadily clamp silicon wafers through electrostatic force, and the ceramic heating plates are used to heat the silicon wafers clamped by the electrostatic chucks so as to maintain the silicon wafers at a specific temperature. The multi-layer composite ceramic plates are widely used in plasma and vacuum environments, such as etching, PVD, CVD, ion implantation and other semiconductor manufacturing processes. Traditional multi-layer composite ceramic plates, including electrostatic chucks and ceramic heating plates, are typically of a multi-layer composite ceramic plate structure comprising one or more metal electrode layers, and have a basic sandwich structure formed by two ceramic dielectric layers and a metal electrode layer located between the two ceramic dielectric layers. When specifically applied to the semiconductor processing equipment, the composite ceramic plates may comprise multiple ceramic dielectric layers and metal electrode layers respectively located between adjacent ceramic dielectric layers.

Technical Problems

The semiconductor manufacturing process has extremely high requirements for the surface roughness and flatness of polished silicon wafers, which in turn puts forward extremely high requirements for the surface roughness and flatness of composite ceramic plates in contact with the silicon wafers. As for the electrostatic chucks, the uniformity of the thickness of a surface insulating dielectric layer determines the uniformity of electrostatic force of different parts of the electrostatic chucks. In addition, during the etching process, even a tiny temperature difference of the surface of the silicon wafers may lead to a great etching deviation, thereby decreasing the etching effect of the wafers. Similarly, the thickness uniformity of different layers of the ceramic heating plates has a direct influence on the distribution of surface temperature of the silicon wafers, thus affecting the precision of the semiconductor manufacturing process. Therefore, the technological requirements for the multi-layer composite ceramic plates, including electrostatic chucks and ceramic heating plates, are uniformity in thickness of each layer of basic sandwich structure and good surface flatness of the multi-layer composite ceramic plates.

At present, two methods commonly used for manufacturing multi-layer composite ceramic plates, including electrostatic chucks and ceramic heating plates, with good flatness and uniform thickness are sintering layer by layer and sintering as a whole, respectively. As for the method of sintering layer by layer, an upper ceramic layer and a lower ceramic layer are sintered separately, and then an electrode layer is sintered on the matrix of one ceramic layer; next, all the layers are packaged and connected to form the basic sandwich structure and ensure the functions of these layers. This method has the advantage that the processing condition of each layer will not be limited by other layers, so the processing quality of these layers is guaranteed. However, in the basic sandwich structure formed through this method, the metal electrode layer is located between the two ceramic layers which are in rigid contact, so a ceramic plate formed after these layers are packaged and connected is unsatisfying in stability and reliability. As for the method of sintering as a whole, three layers of the sandwich structure are formed step by step and then stacked up and sintered as a whole. The two ceramic layers in the basic sandwich structure formed through this method are sintered into a whole, so that all the layers are bonded firmly and reliably. However, the process is too difficult to meet the high requirements for the flatness of these layers.

Thus, there is an urgent need to provide a multi-layer composite ceramic plate which is good in flatness, uniform in thickness and suitable for the semiconductor processing field, and a manufacturing method of the multi-layer composite ceramic plate.

SUMMARY

The present invention aims to provide a multi-layer composite ceramic plate which is good in flatness, uniform in thickness and suitable for the semiconductor processing field, and a manufacturing method of the multi-layer composite ceramic plate.

For this purpose, the invention provides a manufacturing method of a composite ceramic plate, which is simple in process, convenient and easy to implement, suitable for industrial production, high in production efficiency, high in yield, and good in reliability. A multi-layer composite ceramic plate manufactured through this method is good in flatness and uniform in thickness.

The invention provides a multi-layer composite ceramic plate which is good in flatness, uniform in thickness and suitable for serving as an electrostatic chuck and/or a ceramic heating plate in the semiconductor manufacturing process, and a manufacturing method of the multi-layer composite ceramic plate.

A manufacturing method of a multi-layer composite ceramic plate is characterized by using a mold for hot-pressing sintering. The mold is a graphite hot-pressing mold comprising a cylindrical graphite sleeve and two individual and coaxial graphite cylindrical columns in the cylindrical graphite sleeve. The lower one of the two coaxial graphite cylindrical columns acts as a graphite mold base, and the upper one acts as a graphite mold gland/pressing cover (not shown).

The multi-layer composite ceramic plate comprises at least one basic sandwich structure which comprises a first ceramic layer, a second ceramic layer and a metal electrode layer located between the first ceramic layer and the second ceramic layer; the manufacturing method specifically includes the following steps:

(1) Preparing a sheet-like green body with ceramic powders; pre-sintering the green body at a pre-sintering temperature lower than the sintering temperature to obtain a pre-sintered ceramic member with a certain strength;

(2) Preparing a metal electrode layer on the upper surface of the pre-sintered ceramic member;

(3) Placing the pre-sintered ceramic member on the base of the graphite mold, with the upper surface coated with the metal electrode layer facing upwards, and preparing a ceramic precursor layer on the upper surface of the pre-sintered ceramic member; carrying out hot-pressing sintering in the axial direction of the pre-sintered ceramic member at the sintering temperature to form an integral part, wherein by the hot-pressing sintering, the second ceramic layer is formed by the pre-sintered ceramic member; the first ceramic layer is formed by the ceramic precursor layer; the metal electrode layer is located between the first ceramic layer and the second ceramic layer and is integrated with the first ceramic layer and the second ceramic layer, thus forming a basic sandwich structure;

Or preferably, the multi-layer composite ceramic plate comprises two basic sandwich structures; another metal electrode layer and another first ceramic layer being formed on a lower surface of the second ceramic layer, thus forming a five-layer composite ceramic plate comprising two basic sandwich structures; five layers of the five-layer composite ceramic plate being one first ceramic layer, one metal electrode layer, the second ceramic layer, the another metal electrode layer and the another first ceramic layer in sequence; the manufacturing method comprising the following steps:

(1) preparing a sheet-like green body with ceramic powders; pre-sintering the green body at a pre-sintering temperature lower than the sintering temperature to obtain a pre-sintered ceramic member with a certain strength;

(2) preparing a metal electrode layer respectively on the upper surface and the lower surface of the pre-sintered ceramic member to obtain a pre-sintered ceramic member with two metal electrode layers;

(3) coaxially assembling the ceramic precursor layers and the pre-sintered ceramic member with the two metal electrode layers on the base of the graphite mold in a "ceramic precursor layer/pre-sintered ceramic member with the two metal electrode layers/ceramic precursor layer" pattern and then carrying out hot-pressing sintering in the axial direction of the pre-sintered ceramic member to form an integral part, wherein after the hot-pressing sintering, the second ceramic layer is formed by the pre-sintered ceramic member, and the first ceramic layers are formed by the ceramic precursor layers;

raw materials of the two ceramic precursor layers in the five-layer composite ceramic plate comprising the two basic sandwich structures are identical or different, and correspondingly, raw materials of the first ceramic layers are identical or different.

The pre-sintered ceramic member in Step (1) is water-tolerant and is subjected to finish machining, including turning, milling and grinding, within a dimension tolerance of 0.03 mm; and the sheet-like green body in Step (1) is formed by isostatic pressing.

Preferably, before preparing the metal electrode layer on the upper surface of the pre-sintered ceramic member in Step (2), finish machining is carried out on the pre-sintered ceramic member to improve flatness and thickness uniformity of the pre-sintered ceramic member; the flatness of the pre-sintered ceramic member after machining is not greater than 0.03 mm.

Preferably, in Step (2), the metal electrode layer is formed on the pre-sintered ceramic member through a screen printing process or a coating process. Further preferably, the flatness of the metal electrode layer is not greater than 0.03 mm.

Preferably, the ceramic precursor layer in Step (3) is uniformly distributed ceramic powders or a pre-formed unsintered sheet-like green body. Further preferably, the unsintered sheet-like green body is formed by pre-pressing the ceramic powders in the mold.

Preferably, the pre-sintering temperature of the pre-sintered ceramic member in Step (1) is between 20° C. and 600° C., preferably between 100° C. and 400° C., lower than the sintering temperature in Step (3), and the sintering temperature in Step (3) is a densification sintering temperature, varying with the variety of raw materials.

Preferably, the ceramic powders in Step (1) and the ceramic precursor layer in Step (3) are made of one or more of oxides and non-oxides, wherein the oxide is one or two of alumina, zirconia, magnesium aluminate spinel and so on, and the non-oxide is one or two of aluminum nitride, silicon nitride, silicon carbide and so on; after sintered, the second ceramic layer and the first ceramic layer are correspondingly one or more of oxide ceramics and non-oxide ceramics, wherein the oxide ceramic is one or two of alumina ceramic, zirconia ceramic, magnesium aluminate spinel and so on, and the non-oxide ceramic is one or two of aluminum nitride, silicon nitride, silicon carbide and so on.

Preferably, the area of the first ceramic layer and the area of the second ceramic layer are both larger than that of the metal electrode layer; the metal electrode layer is enclosed between the first ceramic layer and the second ceramic layer, and outer edges of the first ceramic layer and the second ceramic layer are in contact with each other and form an integer structure through hot-pressing sintering.

Beneficial Effects

The invention provides a manufacturing method of a composite ceramic plate, and in particular, provides a manufacturing method of a multi-layer composite ceramic plate suitable for the semiconductor manufacturing process. The composite ceramic plate is suitable for being used as an electrostatic chuck and/or a ceramic heating plate in the semiconductor manufacturing process. According to the embodiments of the invention, the composite ceramic plate is good in flatness and uniform in thickness. Compared with traditional manufacturing methods of composite ceramic plates, the manufacturing method provided by the invention has the advantages of high precision, simple process, high yield, and easy processing.

REFERENCE NUMBERS 1, second ceramic layer; 2, metal electrode layer; 3, first ceramic layer; 4, graphite mold base; 5, graphite mold sleeve; 6, pre-sintered ceramic member; 7, ceramic precursor layer.

DESCRIPTION OF THE EMBODIMENTS

For better understanding of the above purposes, features and advantages of the invention, specific embodiments of the invention will be described in detail below in conjunction with the accompanying drawings.

Figure 1:
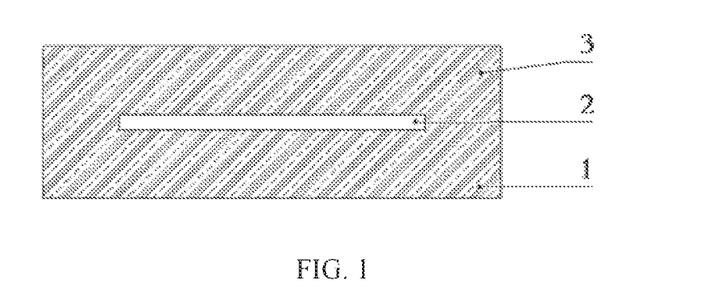
FIG. 1 is a schematic diagram of a basic sandwich structure of a multi-layer composite ceramic plate according to the invention.
Figure 2:
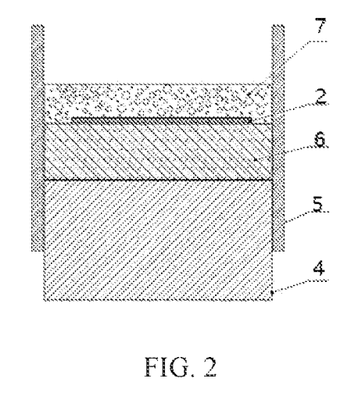
FIG. 2 is a schematic diagram of the manufacturing process of the basic sandwich structure of the multi-layer ceramic plate according to the invention.

Electrostatic chucks and heating plates used in the semiconductor manufacturing process are all multi-layer composite ceramic plates, which have a typical basic sandwich structure. The invention provides a multi-layer composite ceramic plate which is suitable for serving as an electrostatic chuck and a heating plate in the semiconductor manufacturing process, and a manufacturing method of the multi-layer composite ceramic plate. FIG. 1 is a schematic diagram of a basic sandwich structure of the multi-layer composite ceramic plate according to the invention, and FIG. 2 is a schematic diagram of the manufacturing process of the basic sandwich structure of the multi-layer composite ceramic plate according to the invention. The manufacturing process is as follows:

1. A sheet-like green body with a diameter of 300 mm and a thickness of 5 mm is formed by alumina powders, subjected to spray granulation, through a cold isostatic pressing at a pressure of 200 MPa;
2. The sheet-like green body with the diameter of 300 mm and the thickness of 5 mm is held at 1200° C. for 1 h in an oxidizing atmosphere, and is then pre-sintered to obtain a sheet-like pre-sintered alumina ceramic member 6, wherein in this embodiment, the pre-sintering temperature is set to 1200° C.; the setting of the pre-sintering temperature is associated with the temperature of subsequent hot-pressing sintering, and generally, the pre-sintering temperature should be between 20° C. and 600° C., preferably between 100° C. and 400° C., lower than the hot-pressing sintering temperature;
3. Flat grinding is carried out on surfaces of the pre-sintered alumina ceramic member 6 through a numerically-controlled surface grinder to make the flatness of the surfaces of the pre-sintered alumina ceramic member 6 not greater than 0.03 mm, not greater than 0.008 mm in an ideal condition;
4. Metal tungsten paste is printed on one surface of the pre-sintered alumina ceramic member 6 which is subjected to finish machining, through a screen printing method to obtain a metal electrode layer 2, wherein the flatness of the metal electrode layer 2 is not greater than 0.03 mm; in other embodiments, the metal electrode layer 2 may be formed on the pre-sintered ceramic member through a coating process or other film forming process; the material of the metal electrode layer is tungsten in this embodiment, but the material of the metal electrode layer is not limited to tungsten and can also be other suitable metal materials for use as metal electrodes;
5. As shown in FIG. 2, first, the pre-sintered alumina ceramic member 6 coated with the metal electrode layer 2 is stably placed on a graphite mold base 4, and then, a graphite mold sleeve 5 is disposed on the graphite mold base 4, with the upper surface, coated with the metal electrode layer 2, of the pre-sintered alumina ceramic member 6 facing upwards; second, a ceramic precursor layer 7 is provided on the pre-sintered ceramic member 6, wherein the ceramic precursor layer 7 is uniformly distributed alumina powders in this embodiment, and the ceramic precursor layer 7 may be a pre-formed unsintered sheet-like green body in other embodiments; third, hot-pressing sintering is carried out in the axial direction of the pre-sintered alumina ceramic member 6, wherein in this embodiment, the sintering temperature is set to 1600° C., the holding time is 30 min, and the pressure is 20 MPa.

After hot-pressing sintering, the second ceramic layer 1, formed by the pre-sintered ceramic member 6, the first ceramic layer 3, formed by the ceramic precursor layer 7, and the metal electrode layer 2 corresponding to a metal electrode layer 2 in FIG. 1, located between the first ceramic layer 3 and the second ceramic layer 1, form a basic sandwich structure together.

In this embodiment, the ceramic precursor layer 7 and the pre-sintered ceramic member 6 are made of alumina, and alumina ceramics are obtained after the ceramic precursor layer 7 and the pre-sintered ceramic member 6 being hot-pressing sintered. In other embodiments, the ceramic precursor layer 7 and the pre-sintered ceramic member 6 may be made of one or more of alumina, zirconia, magnesium aluminate spinel, aluminum nitride, silicon nitride, and silicon carbide. In other embodiments, the first ceramic layer and the second ceramic layer are one or more of oxide ceramics such as alumina, zirconia, magnesium aluminate spinel and so on. In other embodiments, one or more of the first ceramic layer and the second ceramic layer are one or more of non-oxide ceramics such as aluminum nitride, silicon nitride, silicon carbide and so on. In other embodiments, one or both of the first ceramic layer and the second ceramic layer are composite ceramic.

As shown in FIG. 1, the area of the first ceramic layer and the area of the second ceramic layer are both larger than that of the metal electrode layer, and outer edges of the first ceramic layer and the second ceramic layer are in contact with each other and form a whole by hot-pressing sintering, so that the metal electrode layer is completely packaged.

Embodiment 2

Figure 3:
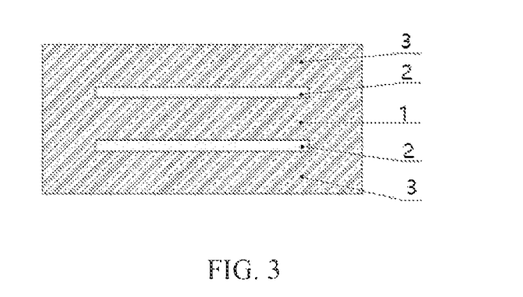
FIG. 3 is a schematic diagram of a five-layer composite ceramic plate comprising two basic sandwich structures.
Figure 4:
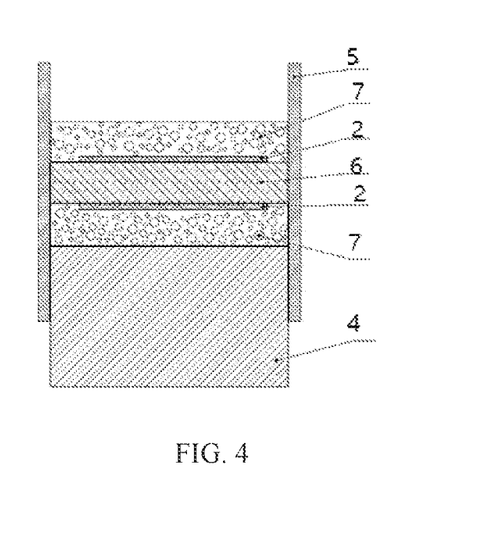
FIG. 4 is a schematic diagram of the manufacturing process of the five-layer composite ceramic plate shown in FIG. 3.

The composite ceramic plate provided by the invention may be a five-layer composite ceramic plate comprising two basic sandwich structures. FIG. 3 is a schematic diagram of the five-layer composite ceramic plate comprising two basic sandwich structures, and FIG. 4 is a schematic diagram of the manufacturing process of the five-layer composite ceramic plate comprising two sandwich structures. As shown in FIG. 3 and FIG. 4.

1. A sheet-like green body with a diameter of 300 mm and a thickness of 5 mm is formed by alumina powders, after spray granulation and cold isostatic pressing at a pressure of 200 MPa;
2. The sheet-like alumina green body with the diameter of 300 mm and the thickness of 5 mm is held at 1200° C. for 1 h in an oxidizing atmosphere to obtain a sheet-like pre-sintered ceramic member 6;

3. Flat grinding is carried out on surfaces of the pre-sintered alumina ceramic member 6 through a numerically-controlled surface grinder to make the flatness of the surfaces of the pre-sintered alumina ceramic member 6 not greater than 0.01 mm, not greater than 0.008 mm in an ideal condition;
4. Metal tungsten paste is printed on upper and lower surfaces of the pre-sintered alumina ceramic member 6 which is subjected to finish machining, through a screen printing method to obtain metal tungsten electrode layers 2, wherein the flatness of the printed metal tungsten electrode layers is not greater than 0.01 mm;
5. As shown in FIG. 4, first, a graphite mold sleeve 5 is disposed around a graphite mold base 4, and then a ceramic precursor layer 7 is provided on the graphite mold base 4 (the ceramic precursor layer 7 can be uniformly distributed alumina powders or a pre-formed unsintered sheet-like green body); the pre-sintered alumina ceramic member 6 having two sides coated with the metal electrode layers 2 is stably placed on the ceramic precursor layer 7 which is on the graphite mold base; second, another ceramic precursor layer 7 is provided on the pre-sintered alumina ceramic member 6 (the ceramic precursor layer 7 is uniformly distributed alumina powders or a pre-formed unsintered sheet-like green body); third, hot-pressing sintering is carried out in an axial direction of the pre-sintered alumina ceramic member 6, wherein the sintering temperature is set to 1600° C., the holding time is 30 min, and the pressure is 20 MPa.

Referring to FIG. 3 and FIG. 4, after hot-pressing sintering, a second ceramic layer 1 is formed by the pre-sintered alumina ceramic member 6, and first ceramic layers 3 are respectively formed by the two ceramic precursor layers 7; the upper metal electrode layer 2 corresponds to an upper metal electrode layer 2 of the five-layer composite ceramic plate shown in FIG. 3 and the lower metal electrode layer 2 corresponds to a lower metal electrode layer 2 of the five-layer composite ceramic plate shown in FIG. 3, so that two basic sandwich structures are formed.

In this embodiment, the ceramic precursor layers and the pre-sintered ceramic member are made of alumina, and alumina ceramics are obtained after the ceramic precursor layers and the pre-sintered ceramic member being hot-pressing sintered. In other embodiments, the ceramic precursor layers and the pre-sintered ceramic member may be made of one or more of alumina, zirconia, magnesium aluminate spinel, aluminum nitride, silicon nitride, and silicon carbide. In other embodiments, the first ceramic layers and the second ceramic layer are one or more of oxide ceramic such as alumina, zirconia, magnesium aluminate spinel and so on. In other embodiments, the first ceramic layers and the second ceramic layer are one or more of non-oxide ceramics such as aluminum nitride, silicon nitride, silicon carbide and so on. In other embodiments, one or more of the first ceramic layers and the second ceramic layer are composite ceramic.

As shown in FIG. 3, the area of the first ceramic layers and the area of the second ceramic layer are both larger than that of the metal electrode layers, and outer edges of every adjacent two of the first ceramic layers and the second ceramic layer are in contact with each other and form a whole through hot-pressing sintering, so that the metal electrode layers are completely packaged.

Although the invention has been disclosed above, the invention is not limited to the above description. Any skilled in the art can make various changes and modifications without departing from the spirit and scope of the invention. Therefore, the protection scope of the invention should be subjected to the scope defined by the claims.

What is claimed is:

1. A manufacturing method of a multi-layer composite ceramic plate, using a mold for hot-pressing sintering, the mold being a graphite hot-pressing mold comprising a cylindrical graphite sleeve and two individual and coaxial graphite cylindrical columns in the cylindrical graphite sleeve, the lower one of the two coaxial graphite cylindrical columns acting as a graphite mold base, and the upper one of the two coaxial graphite cylindrical columns acting as a graphite mold gland;

the multi-layer composite ceramic plate comprising at least one basic sandwich structure which comprises a first ceramic layer, a second ceramic layer and a metal electrode layer located between the first ceramic layer and the second ceramic layer; the manufacturing method specifically comprising:

(1) preparing a sheet-like green body with ceramic powders; pre-sintering the green body at a pre-sintering temperature lower than a sintering temperature to obtain a pre-sintered ceramic member with a certain strength;

(2) preparing a metal electrode layer on an upper surface of the pre-sintered ceramic member;

(3) placing the pre-sintered ceramic member on the graphite mold base of the mold, with the upper surface coated with the metal electrode layer facing upwards, providing a ceramic precursor layer on the upper surface of the pre-sintered ceramic member, and carrying out hot-pressing sintering in an axial direction of the pre-sintered ceramic member at the sintering temperature to form an integral part, wherein after hot-pressing sintered, the second ceramic layer is formed by the pre-sintered ceramic member, the first ceramic layer is formed by the ceramic precursor layer, and the metal electrode layer located between the first ceramic layer and the second ceramic layer, is integrated with the first ceramic layer and the second ceramic layer, thus forming a basic sandwich structure, wherein the ceramic precursor layer in Step (3) is uniformly distributed ceramic powders or a pre-formed unsintered sheet-like green body;

or;

the multi-layer composite ceramic plate comprising two basic sandwich structures; another metal electrode layer and another first ceramic layer being formed on a lower surface of the second ceramic layer, thus forming a five-layer composite ceramic plate comprising two basic sandwich structures; five layers of the five-layer composite ceramic plate being one first ceramic layer, one metal electrode layer, the second ceramic layer, the another metal electrode layer and the another first ceramic layer in sequence; the manufacturing method comprising:

(1) preparing a sheet-like green body with ceramic powders; pre-sintering the green body at a pre-sintering temperature lower than a sintering temperature to obtain a pre-sintered ceramic member with a certain strength;

(2) preparing a metal electrode layer on each of an upper surface and a lower surface of the pre-sintered ceramic member to obtain a pre-sintered ceramic member with two metal electrode layers;

(3) coaxially assembling ceramic precursor layers and the pre-sintered ceramic member with the two metal electrode layers on the base of the graphite mold in a "ceramic precursor layer/pre-sintered ceramic member with the two metal electrode layers/ceramic precursor layer" pattern and then carrying out hot-pressing sintering in an axial direction of the pre-sintered ceramic member to form an integral part, wherein by the hot-pressing sintering, the second ceramic layer is formed by the pre-sintered ceramic member, and the first ceramic layers are formed by the ceramic precursor layers, wherein the ceramic precursor layer in Step (3) is uniformly distributed ceramic powders or a pre-formed unsintered sheet-like green body;

raw materials of the two ceramic precursor layers in the five-layer composite ceramic plate comprising the two basic sandwich structures are identical or different, and correspondingly, materials of the first ceramic layers are identical or different.

2. The manufacturing method of a multi-layer composite ceramic plate according to claim 1, wherein the pre-sintered ceramic member in Step (1) is subjected to finish machining, including turning, milling and grinding, within a dimension tolerance of 0.03 mm; the sheet-like green body in Step (1) is formed by isostatic pressing.

3. The manufacturing method of a multi-layer composite ceramic plate according to claim 1, wherein before preparing the metal electrode layer on the upper surface of the pre-sintered ceramic member in Step (2), finish machining is carried out on the pre-sintered ceramic member to improve flatness and thickness uniformity of the pre-sintered ceramic member; the flatness of the pre-sintered ceramic member after machining, is not greater than 0.03 mm.

4. The manufacturing method of a multi-layer composite ceramic plate according to claim 1, wherein in Step (2), the metal electrode layer is formed on the pre-sintered ceramic member through a screen printing process or a coating process; and a surface flatness of the metal electrode layer relative to a standard surface flatness gauge is not greater than 0.03 mm.

5. The manufacturing method of a multi-layer composite ceramic plate according to claim 1, wherein the unsintered sheet-like green body is formed by pre-pressing the ceramic powders in the mold.

6. The manufacturing method of a multi-layer composite ceramic plate according to claim 1, wherein the pre-sintering temperature of the pre-sintered ceramic member in Step (1) is between 20° C. and 600° C., and the sintering temperature in Step (3) is a densification sintering temperature.

7. The manufacturing method of a multi-layer composite ceramic plate according to claim 1, wherein the ceramic powder in Step (1) and the ceramic precursor layer in Step (3) are made of one or more of oxides and non-oxides, wherein the oxide is one or two of alumina, zirconia and magnesium aluminate spinel, and the non-oxide is one or two of aluminum nitride, silicon nitride, and silicon carbide; and after sintered, the second ceramic layer and the first ceramic layer are correspondingly one or more of oxide ceramics and non-oxide ceramics, wherein the oxide ceramic is one or two of alumina ceramic, zirconia ceramic and magnesium aluminate spinel, and the non-oxide ceramic is one or two of aluminum nitride, silicon nitride, and silicon carbide.

8. The manufacturing method of a multi-layer composite ceramic plate according to claim 1, wherein an area of the first ceramic layer and an area of the second ceramic layer are both larger than that of the metal electrode layer; the first ceramic layer and the second ceramic layer, whose outer edges are in contact with each other, and the metal electrode layer, enclosed between the first ceramic layer and the second ceramic layer, form an integral structure through the hot-pressing sintering.

9. The manufacturing method of a multi-layer composite ceramic plate according to claim 6, wherein the pre-sintering temperature of the pre-sintered ceramic member in Step (1) is between 100° C. and 400° C. lower than the sintering temperature in Step (3).

* * * * *